US010589980B2

(12) United States Patent
Oden et al.

(10) Patent No.: US 10,589,980 B2
(45) Date of Patent: Mar. 17, 2020

(54) ISOLATED PROTRUSION/RECESSION FEATURES IN A MICRO ELECTRO MECHANICAL SYSTEM

(71) Applicant: Texas Instruments Incorporated, Dallas, TX (US)

(72) Inventors: Patrick Ian Oden, McKinney, TX (US); James Carl Baker, Coppell, TX (US); Sandra Zheng, Plano, TX (US); William C. McDonald, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 81 days.

(21) Appl. No.: 15/481,704

(22) Filed: Apr. 7, 2017

(65) Prior Publication Data
US 2018/0290880 A1    Oct. 11, 2018

(51) Int. Cl.
*B81B 3/00*    (2006.01)
*G02B 26/08*    (2006.01)

(52) U.S. Cl.
CPC .......... *B81B 3/001* (2013.01); *G02B 26/0833* (2013.01); *B81B 2201/042* (2013.01); *B81C 2201/0157* (2013.01)

(58) Field of Classification Search
CPC . B81B 3/001; B81B 3/0051; B81B 2201/042; B81C 1/00436; B81C 1/00246; B81C 1/0023; B81C 1/00198; B81C 1/0096; B81C 2201/11; B81C 2201/0157; G02B 26/0816; G02B 26/0833; G02B 26/0841; G02B 26/0866
See application file for complete search history.

(56) References Cited

U.S. PATENT DOCUMENTS

| | | | |
|---|---|---|---|
| 7,011,415 B2 | 3/2006 | DiCarlo et al. | |
| 7,404,909 B2 | 7/2008 | Rothenbury | |
| 8,179,591 B2 | 5/2012 | Sugimoto et al. | |
| 9,348,136 B2 | 5/2016 | McDonald et al. | |
| 2004/0187592 A1* | 9/2004 | Sugiura | G01C 19/5719 73/780 |

(Continued)

FOREIGN PATENT DOCUMENTS

| | | | |
|---|---|---|---|
| WO | 2011112260 A2 | 9/2011 | |
| WO | WO-2013145735 A1 * | 10/2013 | ............. B81B 3/007 |

OTHER PUBLICATIONS

International Search Report for PCT/US2018/026592 dated Oct. 4, 2018.

(Continued)

*Primary Examiner* — Kimberly N. Kakalec
(74) *Attorney, Agent, or Firm* — Michael A. Davis, Jr.; Charles A. Brill; Frank D. Cimino

(57) ABSTRACT

In described examples, a microelectromechanical system (MEMS) includes a first element and a second element. The first element is mounted on a substrate and has a first contact surface. The second element is mounted on the substrate and has a second contact surface that protrudes from the second element to form an acute contact surface. The first element and/or the second element is/are operable to move in: a first direction, such that the first contact surface comes in contact with the second contact surface; and a second direction, such that the second contact surface separates from the first contact surface.

7 Claims, 11 Drawing Sheets

(56) References Cited

U.S. PATENT DOCUMENTS

| | | | |
|---|---|---|---|
| 2008/0003784 A1* | 1/2008 | Pan | B81C 1/00246 |
| | | | 438/479 |
| 2010/0091372 A1* | 4/2010 | Yamanoi | B81B 3/0054 |
| | | | 359/578 |
| 2010/0219716 A1* | 9/2010 | Akashi | B81B 3/001 |
| | | | 310/309 |
| 2013/0111992 A1* | 5/2013 | O'Brien | G01P 15/125 |
| | | | 73/504.12 |
| 2014/0168743 A1* | 6/2014 | Suzuki | G02B 26/101 |
| | | | 359/263 |
| 2015/0239731 A1 | 8/2015 | Ahtee et al. | |

OTHER PUBLICATIONS

Waits, et al.; "Investigation of gray-scale technology for large area 3D silicon MEMS structures"; Journal of Micromechanics and Microengineering; Dec. 24, 2002; pp. 170-177.

"Digital Light Processing", Wikipedia, pp. 1-3, available at https://en.wikipedia.org/wiki/Digital_Light_Processing on Jan. 26, 2017.

Hans-Jurgen Butt and Michael Kappl, "Normal Capillary Forces", ScienceDirect, Advances in Colloid and Interface Science, Nov. 1, 2008, pp. 48-60.

Benjamin Lee, "DMD 101: Introduction to Digital Micromirror Device (DMD) Technology", Texas Instruments Inc., Application Report DLPA008A, Jul. 2008, revised Oct. 2013, pp. 1-11.

Christopher M. Waits et al, "MEMS-based Gray-Scale Lithography", 2001 International Semiconductor Device Research Symposium, Washington, DC, Dec. 5-7, 2001, pp. 182-185.

* cited by examiner

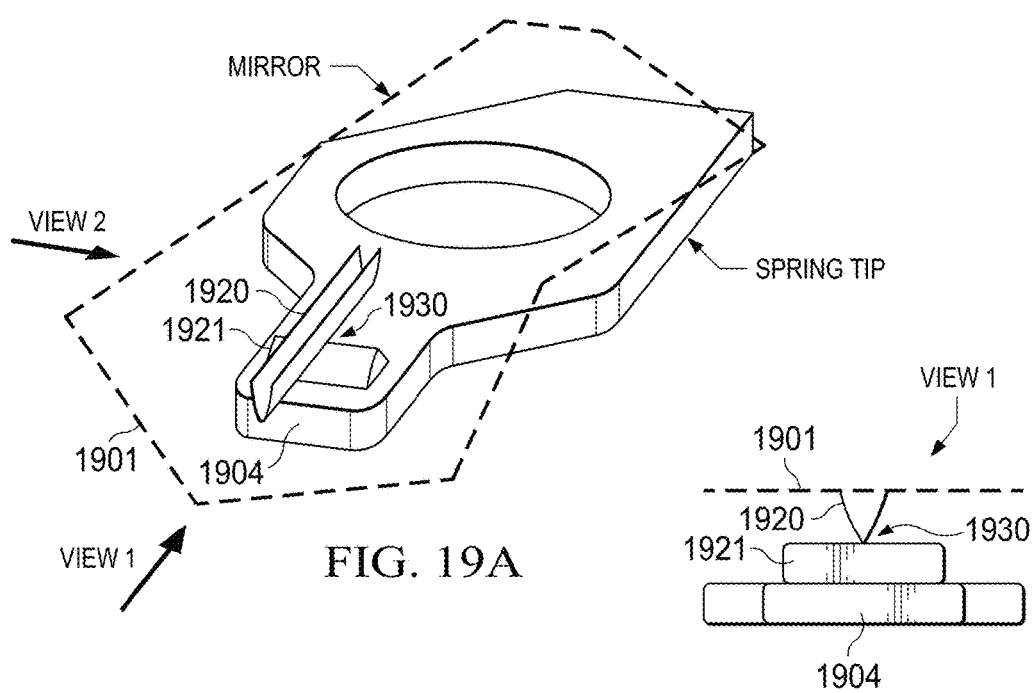
FIG. 19A
FIG. 19B
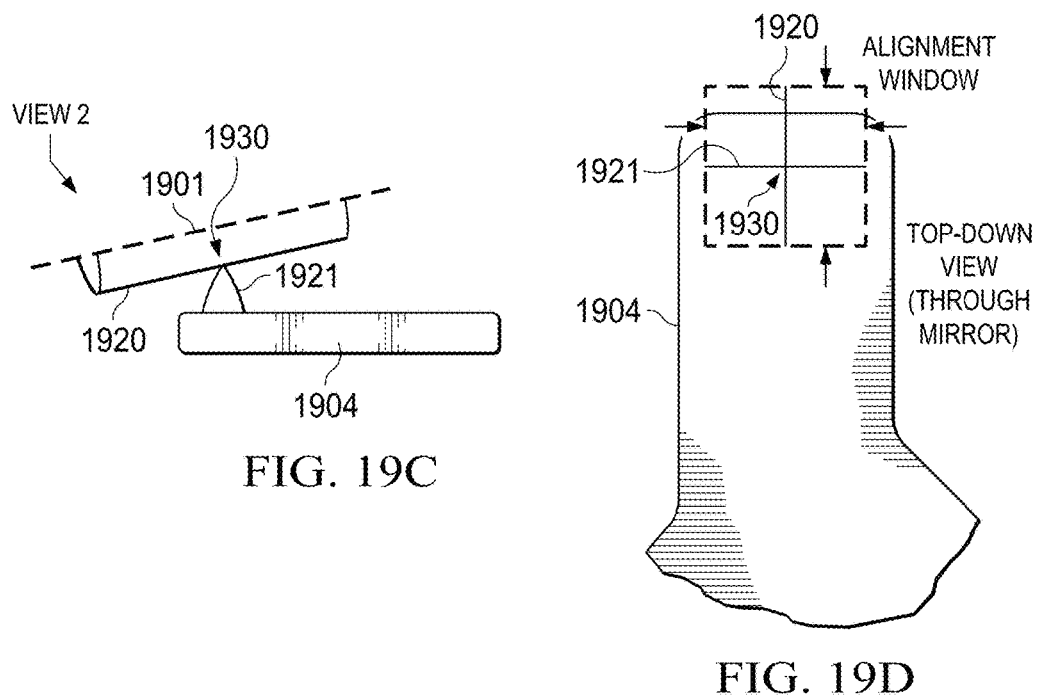
FIG. 19C
FIG. 19D

ISOLATED PROTRUSION/RECESSION FEATURES IN A MICRO ELECTRO MECHANICAL SYSTEM

TECHNICAL FIELD

This relates generally to a microelectromechanical system, and more particularly to reducing stiction between moving parts.

BACKGROUND

A digital micromirror device (DMD) is a digitally controlled optical microelectromechanical system (MEMS) device. In at least one example, the DMD is a fast, reflective digital light switch. It can be combined with image processing, memory, a light source and optics to form a projector that is capable of projecting large, bright, high-contrast color images.

If an integrated circuit (IC) does not have a moving component (e.g., with mechanical operation), then the IC can be fabricated with two-dimensional or planar structures. Some MEMS fabrication techniques have been developed from integrated circuit (IC) fabrication techniques. For example, various MEMS devices have been fabricated with nominally vertical sidewalls (dry anisotropic etching), undercut sidewalls (wet isotropic etching), or sidewalls that have limited angles due to the crystallographic orientation of the substrate (wet anisotropic etching). A technique called gray-scale lithography, typically in diffractive optics, may be applied using a one level development process to create three-dimensional (3D) structures in photoresist.

SUMMARY

In described examples, a microelectromechanical system (MEMS) includes a first element and a second element. The first element is mounted on a substrate and has a first contact surface. The second element is mounted on the substrate and has a second contact surface that protrudes from the second element to form an acute contact surface. The first element and/or the second element is/are operable to move in: a first direction, such that the first contact surface comes in contact with the second contact surface; and a second direction, such that the second contact surface separates from the first contact surface.

BRIEF DESCRIPTION OF THE DRAWINGS

FIGS. 19A through 19D illustrate another embodiment that includes complimentary wedge shaped contact surfaces.

DETAILED DESCRIPTION OF EXAMPLE EMBODIMENTS

Figure 1:
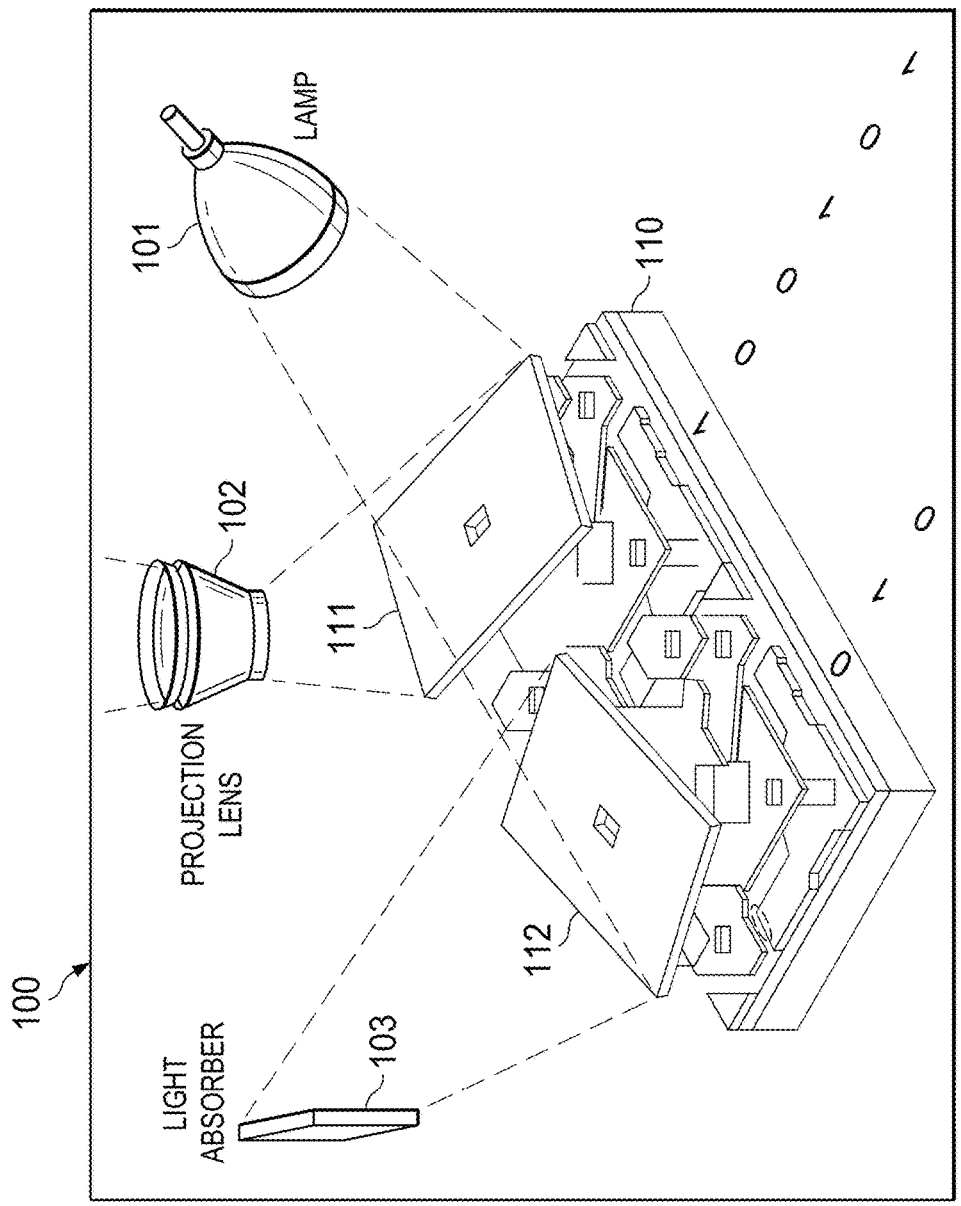
FIG. 1 illustrates basic components of an image display system that includes a MEMS device spatial light modulator (SLM) for the projection of images.

Like elements in the drawings are denoted by like reference numerals for consistency.

FIG. 1 illustrates basic components of an image display system 100 that includes a MEMS device spatial light modulator (SLM) 110 integrated circuit (IC) for the projection of images. Light from a light source 101 may be directed onto an array of pixel modulator elements 111, 112 whose positions are individually settable in synchronization with image data. The incident light is directed either onto an imaging surface through a projection lens 102 when an element is in the "ON" position or directed away from the imaging surface and blocked, such as to a light absorber 103 when the element is in the "OFF" position. For simplicity, FIG. 1 illustrates an array with only two modulator elements; however, an IC array will usually have thousands of such elements arranged in rows and columns, with individual elements having a correspondence with pixel positions of a projected image.

Usually, each pixel modulator element has a mirror 111, 112 that can be tilted in two directions. In each direction, the mirror may come to rest against a fixed landing element. As described in more detail hereinbelow, the mirror tends to "stick" to the fixed landing element due to what is referred to as "stiction." For example, stiction may be caused by Van der Waals force interactions together with meniscus/capillary formation. Van der Waals forces are driven by induced electrical interactions between two or more atoms or molecules that are very close to each other. Capillaries may form in non-UHV (ultra-high vacuum) and non-encompassed systems and are usually dominated by water and other condensable/mobile species in the headspace and surrounding surfaces.

The amount of adhesion or stiction between a movable element and a fixed element is a factor in how much force is required to cause the movable element to move or release form contact. Example embodiments may include contact surfaces (for the moveable mirrors in an SLM) that are in the form of a protrusion to reduce the contact surface area and thereby reduce the amount of stiction between a mirror element and a landing element. SLM devices are described herein, but example embodiments are further applicable to a wide variety of MEMS components and configurations, in order to reduce the force required to overcome stiction (when causing ultra small mechanical elements to move).

Figure 2:
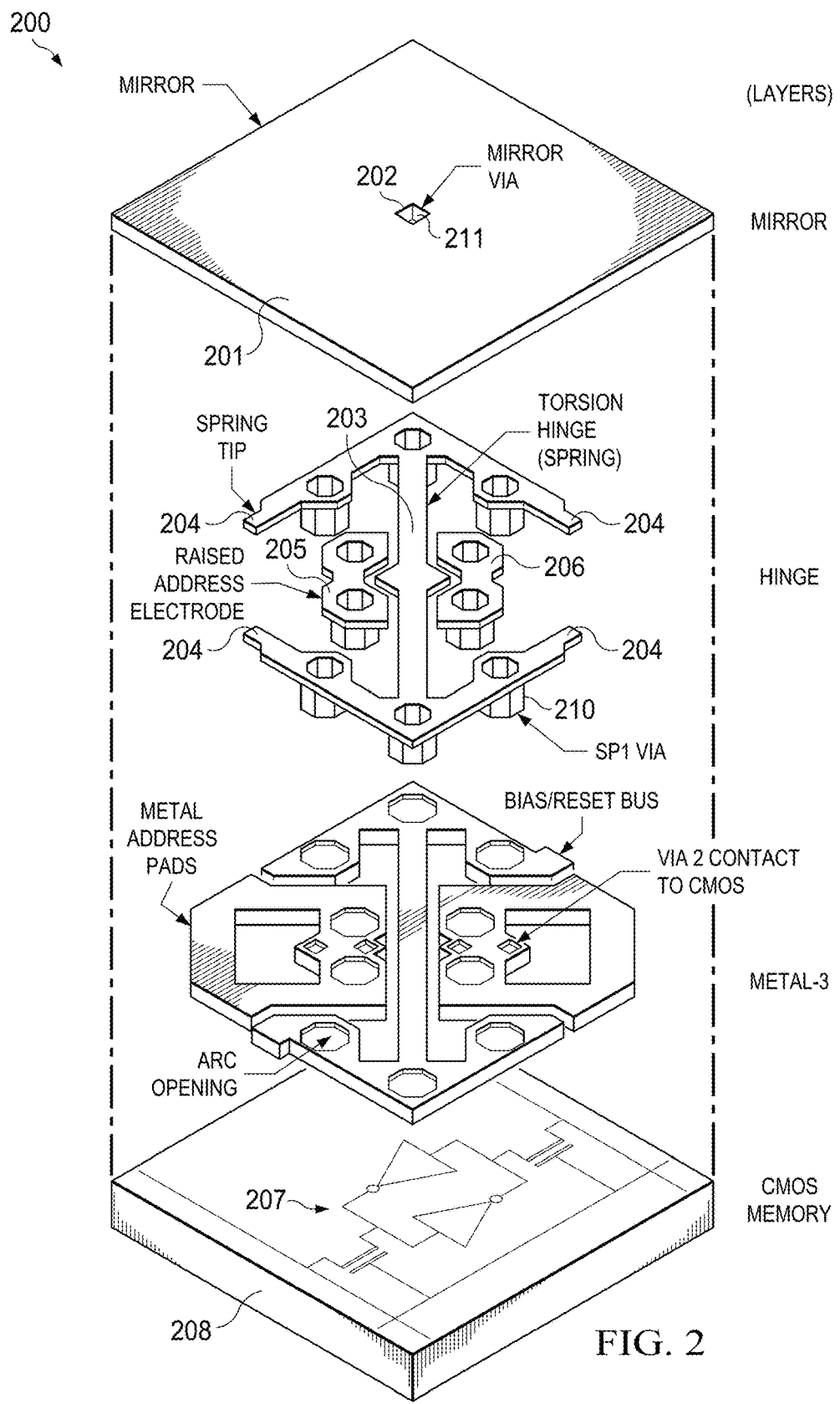
FIG. 2 is an exploded view illustrating the structure of a pixel modulator element.

FIG. 2 illustrates the structure of a pixel modulator element 200 used in the SLM of FIG. 1. Pixel modulator element 200 includes a micromirror 201. An array of micromirrors on a single integrated circuit (IC) may form the SLM of FIG. 1. An IC with an array of pixel modulator elements 200 may also be referred to as a digital micromirror device (DMD), which is a digitally controlled optical MEMS device. When coupled with a source of illumination and suitable optical system components, the DMD may be used to modulate the amplitude and/or direction of incoming light for creating images or other light patterns. The DMD may be used for light modulation for display of images. Other uses of a DMD include structured light, augmented reality, microscopy, medical instruments, spectroscopy, machine vision, industrial inspection, 3D scanning, 3D optical metrology, automated fingerprint identification, face recognition, interactive display, information overlay, chemical analyzers, photo-stimulation, virtual gauges, and many other applications. The DMD may be used in systems providing image projection, in systems providing image capture, or in systems providing both image projection and image capture. Light sources which may be modulated by a DMD include Xenon lamps, laser light sources, LEDs, and phosphor emissions.

A DMD chip may be fabricated using CMOS-like processes over a CMOS memory. It has an array of individually addressable mirror elements, each having a mirror that can reflect light in one of a plurality of directions depending on the state of an underlying memory cell. By combining the DMD chip with a suitable light source and projection optics, the mirror reflects incident light either into or out of the pupil of the projection lens. Thus, the first state of the mirror appears bright and the second state of the mirror appears dark. Gray scale is achieved by binary pulse width modulation of the incident light. Color is achieved by using color filters, either stationary or rotating, in combination with one, two, or three DMD chips.

DMD chips may have a variety of designs, with the most popular design being a structure having a mirror that is rigidly connected to an underlying yoke. The yoke is connected by two thin mechanically compliant torsion hinges to support posts that are attached to the underlying substrate. Electrostatic fields that develop between the underlying memory cell and the mirror cause rotation in the positive or negative rotation direction.

In example embodiments, fabrication of the DMD chip superstructure begins with a completed CMOS memory circuit. Through the use of photoresist layers, the superstructure is formed with alternating layers of aluminum for the address electrode, hinge, yoke, and mirror layers and hardened photoresist for sacrificial layers that form air gaps.

The general operation and construction of a DMD chip is described in U.S. Pat. No. 9,348,136, issued May 24, 2016, entitled Micromirror Apparatus and Methods, which is incorporated by reference herein. Other examples of conventional MEMS devices employing micromirrors are described in U.S. Pat. Nos. 7,011,415 and 7,404,909, the entireties of all of which are incorporated herein by reference.

A DMD chip usually includes a micromirror array, a memory array, a data & controller receiver, and a micromirror array reset control. The micromirror array usually includes many hundreds of thousands (sometimes 1 million or more) of reflective, individually positionable digitally switchable, micrometer-sized mirrors, organized in a two dimensional n column by m row or other systematically arranged array.

Conventional micromirrors may be aluminum elements approximately 5-10 microns in size (e.g., 7.6 micron pitch) and switchable between discrete angular positions of +12 degrees ("ON" state) to −12 degrees ("OFF" state) relative to a 0 degree flat reference state when mirrors are parked in an inactive state, parallel to the plane of the array. The parked position is not a latched position. The individual micromirror angular positions are relatively flat, but will vary. The tilt direction is perpendicular to the hinge-axis. The "ON"-state position is directed toward one side of the package, the "OFF"-state position is directed to the other side of the package.

The memory array is usually a two-dimensional array of 1-bit CMOS memory cells, organized in a grid of n memory cell columns times m memory cell rows. The memory array may be addressed on a column-by-column basis, over a double data rate (DDR) bus. The DMD is usually operated in conjunction with a digital controller chip. Each individual micromirror is positioned over a corresponding CMOS memory cell. The angular position of a particular mirror is determined by the binary state (logic 0 or 1) of the corresponding CMOS memory cell contents after the mirror clocking pulse is applied. The angular position (+12 degrees or −12 degrees) of the individual mirror changes synchronously with the micromirror clocking pulse, rather than being coincident with the memory cell data update. Thus, writing logic 1 into a memory cell followed by a mirror clocking pulse results in the corresponding mirror switching to a +12 degree ON-state position, and writing logic 0 into a memory cell following by a mirror clocking pulse results in the corresponding mirror switching to a −12 degree OFF-state position. Updating the angular position of the mirror array is done in two steps. First, updating the contents of the memory. Second, application of a mirror reset to all or a portion of the mirror array (depending on the configuration of the system). Mirror reset pulses are generated internally by the DMD chip, with the application of the pulses being coordinated by the controller.

Referring again to FIG. 2, mechanically pixel modulator element 200 includes a micromirror 201 attached by a via support column 202 to a torsional hinge 203. The mirror makes contact with a landing element below in the form of spring tips 204. Electrodes 205, 206 are used in electrostatically hold the mirror in either of the two operating positions.

Below each micromirror 201 is a memory cell 207 formed from CMOS memory elements. The state of the pixel memory cell plays a part in the mechanical position of the mirror; however, loading the memory cell does not automatically change the mechanical state of the mirror. Although the state of the CMOS cell plays a part in determining the state of the mirror, it is not the sole factor. After the mirror has landed, changing the state of the memory cells will not cause the mirror to flip to the other state. Therefore, memory state and mirror state are not directly linked together.

For the state of the CMOS memory to be transferred to the mechanical position of the mirror, the pixel must undergo a "Reset." This Reset momentarily releases the mirror and then re-lands the mirror based on the state of the CMOS memory below. A Reset allows groups of pixels to be pre-loaded and then change their mechanical position simultaneously.

The DMD is usually fabricated as a MEMS component containing an array of aluminum micromirrors atop a CMOS substrate 208 that digitally switch in a binary state. A usual configuration includes a uniform band of border micromirrors (referred to as a "pond") around the perimeter of the central core of active micromirrors in the array. These border micromirrors are not user-addressable, but are tilted into the −12 degree OFF position after power has been applied to the device. An example implementation has 10 border mirrors on each side of a 912 by 1140 active mirror array. The border mirrors serve the purpose of directing stray incident light out of the field of view of the projected light path.

The Texas Instruments DLP5500 DMD is an example of a digitally controlled MEMS spatial light modulator (SLM)

that, when coupled to an appropriate optical system, can be used to modulate the amplitude, direction and/or phase of incoming (illumination) light.

Architecturally, the DLP5500 is a latchable, electrical-in, optical-out semiconductor device (micro electro-optical-mechanical system or MEOMS). The DLP5500 is one of three components in the Texas Instruments DLP® 0.55 XGA chip-set. Other components of the chip-set are the Texas Instruments DLPC200 and DLPA200, which control and coordinate the data loading and micromirror switching. DLP® and the DLP logo are registered trademarks of Texas Instruments Incorporated.

Figure 3:
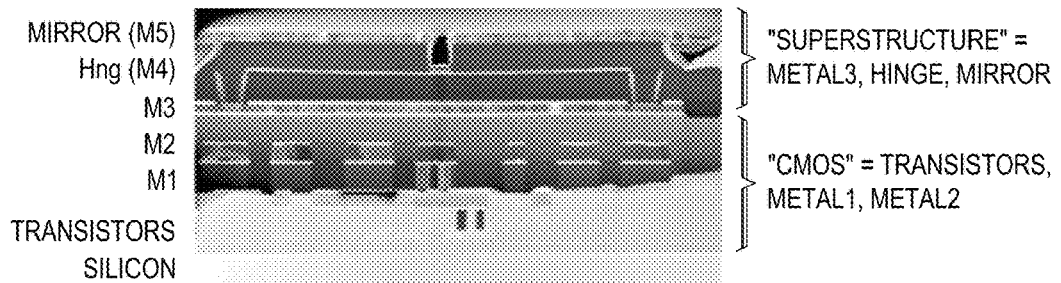
FIG. 3 illustrates a cross-section taken along the diagonal hinge axis showing the construction of the pixel element.

FIG. 3 illustrates a cross-section taken along the diagonal hinge axis showing the construction of the pixel element. The MEMS mirrors at each pixel position are formed as a superstructure over a silicon chip which has been processed using CMOS processing steps to form the memory array. The CMOS circuitry comprises transistors (doped silicon), contacts, and interconnects formed in two patterned layers of metal referred to as "Metal 1" (M1) and "Metal 2" (M2). Contacts to the underlying CMOS circuitry, such as "Via 2 Contact to CMOS" in FIG. 2, metal address pads, and bias/reset bus elements (see FIG. 2) are formed through deposition and patterning of a third conductive layer, referred to as "Metal 3" (M3). A first sacrificial layer (e.g., photoresist) is formed and patterned over the patterned conductive layer M3. The pattern includes via openings. A layer of hinge forming material includes one or more layers of metal, referred to as "Metal 4" (M4) that is formed over the patterned first sacrificial layer, and patterned to form a torsion hinge (spring) 203 with spring tip extensions 204 and raised address electrodes 205 (FIG. 2). The hinge forming material extends conformally into the via openings to define supports 210 for the hinge ("SPI Via" in FIG. 2) and for the raised electrodes. A second sacrificial layer (e.g., also photoresist) is formed and patterned over the patterned hinge forming layer M4. The pattern includes a central via opening. A layer of mirror forming material includes one or more layers of metal referred to as "Metal 5" (M5) that is formed over the patterned second sacrificial layer, and patterned to form a reflective element (such as rectangular-shaped mirror). The mirror forming material extends into the via opening to define a support 211 for the mirror ("Mirror Via" in FIG. 2). To provide flatness, the second sacrificial layer is planarized before deposition of the mirror forming material. The first and second sacrificial layers provide support to the hinge and mirror forming layers during fabrication and are subsequently removed to release the hinge and mirror following formation.

Figure 4:
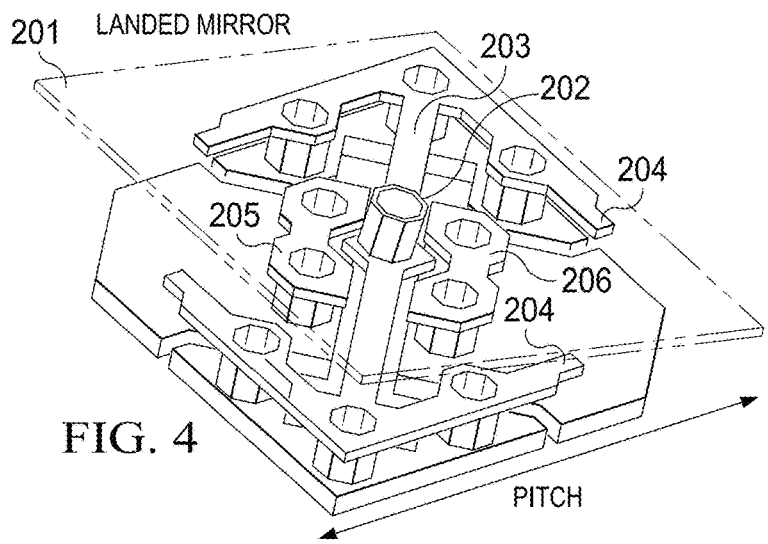
FIGS. 4 and 5 illustrate the pixel structure of FIG. 2, with the mirror tilted to a 12 degree tilt angle.
Figure 5:
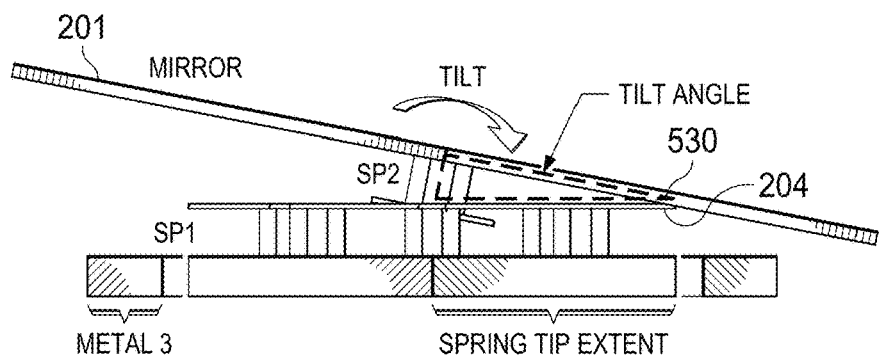

FIGS. 4 and 5 illustrate the pixel structure of FIG. 2, with the mirror tilted to a 12 degree tilt angle after setting in consequence of a Reset signal to the "ON" (+12 degree) or "OFF" (−12 degree) position in accordance with the logic 1 or logic 0 state stored in the underlying CMOS memory cell. Setting the position of each mirror occurs electrostatically. The output of the memory cell (logic 1 or logic 0, corresponding to the bit-plane bit for that pixel position) and its complement control the opposite potentials applied to mirror electrodes 205, 206 located below the mirror on respective sides of the hinge axis. When an appropriate bias/reset potential is applied to the mirror (or mirror/yoke assembly), the mirror tilts about its hinge axis in attraction to the electrode with the greatest potential difference relative to the bias/reset potential. The mirror lands on the spring tips 204 closest to that electrode, preventing contact of the mirror with the electrode and pre-loading the mirror for release under stored energy of spring action. When the bias is removed (allowed to float or set to 0 volts), the mirror returns to a flat state in response to torsion spring 203. Energy stored by spring tips 204 and torsion spring 203 must be sufficient to overcome stiction between micromirror 201 and spring tips 204 at contact point 530.

Several embodiments of contact surfaces may be formed on springs tips 204 and/or the bottom of micromirror 201 to reduce stiction at contact point 530.

Figure 6A:
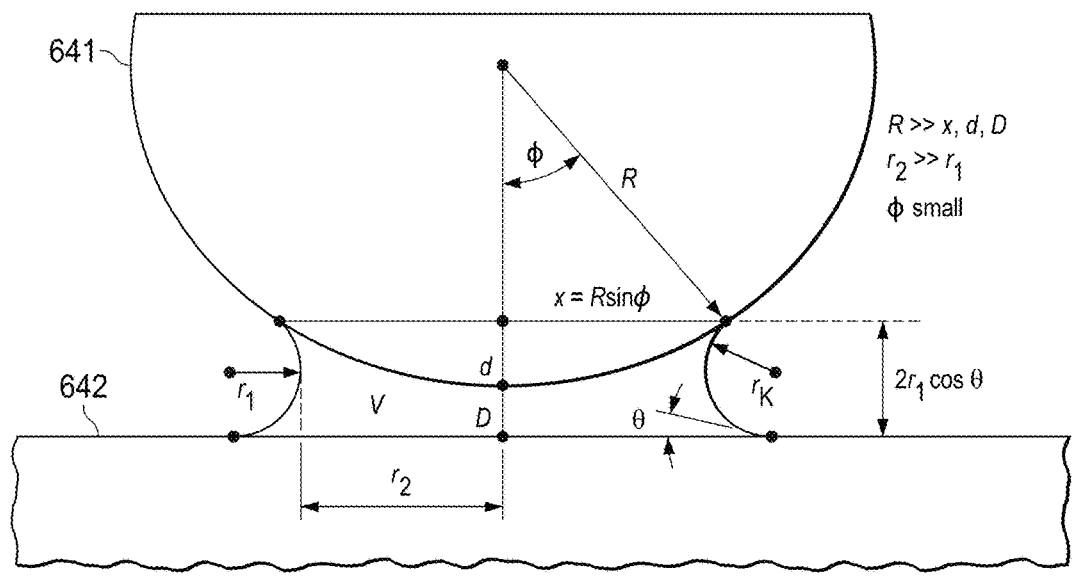
FIGS. 6A through 6C illustrate capillary condensation.

FIG. 6A illustrates an example capillary condensation model. Capillaries always form in non-UHV (ultra high vacuum) and non-encompassed solution based systems and are usually dominated by water and other condensable/mobile species in the headspace of MEMS package and surrounding surfaces. Reducing the stiction impact of this capillary phenomena within DMD devices has usually been the domain of head-space chemistry regimen, with the mechanical addition of spring-tips (STs) to overcome the adhesive energy associated with this feature. This interaction can be given by Laplace Pressure expression (1).

$$\Delta p = (-2\pi R)(d\gamma_L/r_1) \tag{1}$$

R is the radius of a spherical surface 641 adjacent a flat surface 642. The second bracketed term in this force expression is related to the degree to which the meniscus shapes around the mechanical contact through the radius of the meniscus ($r_1$) and the correlated distance it rises on the sphere (d) along with the interfacial energy of the capillary ($\gamma_L$). This term is primary associated with the chemistry of the system. The first bracketed term in this force expression is related to the geometry of the surface and is negative implying that this is attractive.

A direct correlation exists between: (a) the interaction force of the meniscus/capillary; and (b) the radius (R) of the structure 641. A smaller radius yields a smaller capillary and therefore a smaller interaction force. Also, imagine having two spheres interacting in the same fashion with a similar base relationship. A smaller radius of curvature of the two spheres, presuming that they are comparable, results in a smaller force interaction.

Experiments using an Atomic Force Microscope (AFM) have shown that for air-ambient conditions, a nominal AFM probe will see approximately 40 nN-200 nN of force interaction with a flat surface. The details beyond this depend upon the hydro-phobicity/philicity of the surfaces and the relative humidity of the environment. Further experiments have shown that by providing a protruding acute contact feature, such as a wedge or cone shape, the force interaction between the AFM probe and the protruding contact feature may be reduced by a factor of approximately five. This suggests that protruding acute contact features may provide significant reduction in stiction between moving parts of a MEMS device.

Details of this reduction can be shown in more detail through modeling the meniscus formation for a sphere/flat system and sphere/sphere, such as described by H-J. Butt, Michael Kappl, Advances In Colloid & Interface Science, Volume 146, Issues 1-2, 28 Feb. 2009, Pages 48-60. It is shown therein that in comparable dimensional systems of a sphere-plane & sphere-sphere, the force interaction of the sphere-sphere will be approximately half that of the sphere-plane. However, the sphere-plane has a significant advantage over the intimate contact that exists with the plane-plane contact at a wedge angle that may occur between a mirror and spring tip of a DMD, for example.

Figure 6B:
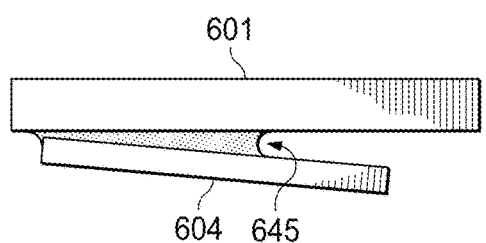

FIG. 6B illustrates an example of capillary condensation that may occur between two MEMS elements, such as a micromirror 601 resting on a spring tip 604. A "wedge" 645 of water or other mobile species may condense and fill in the gap between the mirror and spring tip. Surface tension of the wedge of water 645 may significantly increase the stiction between mirror 601 and spring tip 604.

Figure 6C:
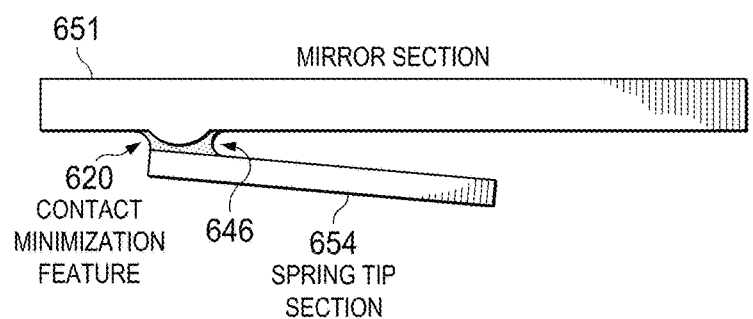

FIG. 6C illustrates a small "minimal contact" protruding feature 620 that may cause a separation between element 601 and 604 and thereby reduce the amount condensate 646 that may collect between the two elements. Reducing the amount of condensate may also reduce the amount of stiction between the two elements.

Figure 7:
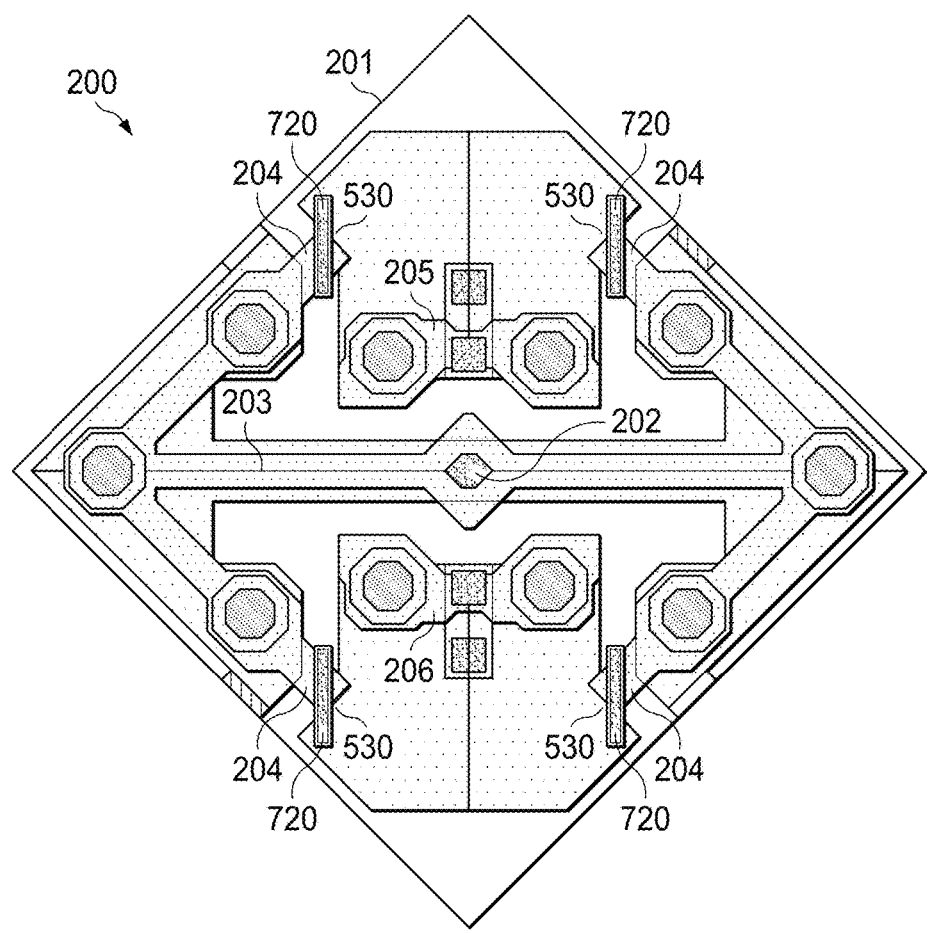
FIG. 7 is a phantom top view of the pixel modulator element of FIG. 2.

FIG. 7 is a phantom top view of pixel modulator element 200. In this example, protrusion features 720 are formed on the bottom side of tiltable micromirror 201 in order to reduce a contact area 530 between the bottom side of micromirror 201 and each of the fingers 204, referring again to FIG. 5. In this example, protrusion features 720 are illustrated as being linear wedges or "ribs" in which a rounded edge of the wedge forms a minimal contact surface due to a low radius of curvature (ROC). In another example, the protrusion features may be an ellipsoidal cap, or an array of ellipsoidal caps. In yet another example, a protrusion feature on the bottom side of micromirror 201 may contact a protrusion feature extending from the top side of spring tip 204. Other embodiments may include other shapes and configurations of protruding features that result in a small contact area between a movable element and another element in a MEMS device.

In this example, the ROC of the contact surface of protrusion features 720 may be less than 1 um. In some of the embodiments described herein, the ROC may be as low as 0.2 um. Significant reduction in stiction may be obtained with protrusion features that have a contact surface with an ROC that is less than approximately 10 um, for example. Protrusion features with a minimal contact surface having such a small ROC may be referred to as having a "sharp" or "acute" contact surface.

In this example, gray-scale lithography methods may be used to construct a one dimensional (1-D) 'rib' feature 720 at the location where the DMD spring tips 204 are to make contact with the backside of the micromirror 201. As used herein, "1-D" refers to the fact that the acute contact region of the rib feature has a length, but the width of the acute edge is essentially zero. Each contact rib may be arranged approximately parallel to the length of the spring tip so as to provide a point contact when the rib interacts with the end of the ST. The curl angle of the ST, together with the tilt angle of the mirror interacting with the ST and the separation introduced by the rib standing off the mirror will reduce the interaction area and therefore the extent of the meniscus formed. This will act to physically diminish the adhesion force of the ST-mirror junction. The placement of the rib may be chosen to be symmetrically placed along the width of the ST and its overall length is chosen to allow for the anticipated manufacturing tolerances of 0.09 um/pattern level [or 0.18 um with two levels in this situation between M4 (hinge) and M5 (mirror)], so as to ensure that a contact will be formed through manufacturing variations in the fabrication process of this material.

FIGS. 8A through 8F are cross-sectional views illustrating formation of a protruding contact surface feature on an element of a MEMS device. FIGS. 8A through 8F illustrate an example for fabricating protruding contact surface feature on the bottom side of a micromirror in the pixel elements of FIG. 2; however, example embodiments are not limited to DMD devices and may be applied to a variety of movable elements embodied in a MEMS, in which a small contact surface may reduce stiction forces between the MEMS elements.

Figure 8A:
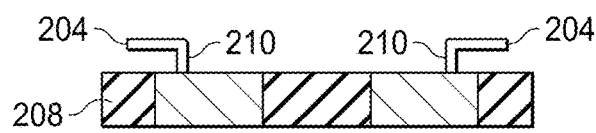
FIGS. 8A through 8F are cross-sectional views illustrating formation of a protruding contact feature on an element of a MEMS device.

In FIG. 8A, CMOS substrate 208 has been fabricated using semiconductor processing steps to form circuitry and memory cells, as described hereinabove in connection with FIGS. 2 and 3. Elevated spring tip elements 204 and vias 210 have been fabricated using a sacrificial layer, such as a photoresist to form cavities for vias 210, followed by formation of a metal layer followed by an etching process to form spring tips 204 and vias 210, as shown in FIG. 2.

Figure 8B:
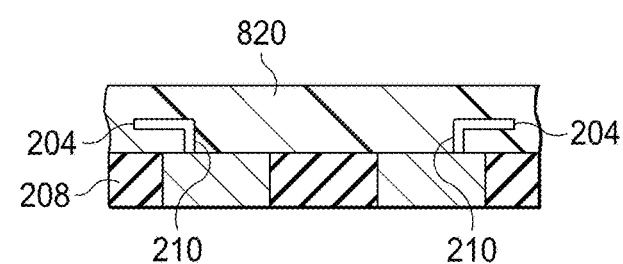

FIG. 8B illustrates formation of a sacrificial layer 820, such as a photoresist layer. Layer 820 is thick enough to provide vertical relief for the next level of the MEMS, such as micromirror 201, referring again to FIG. 2.

Figure 8C:
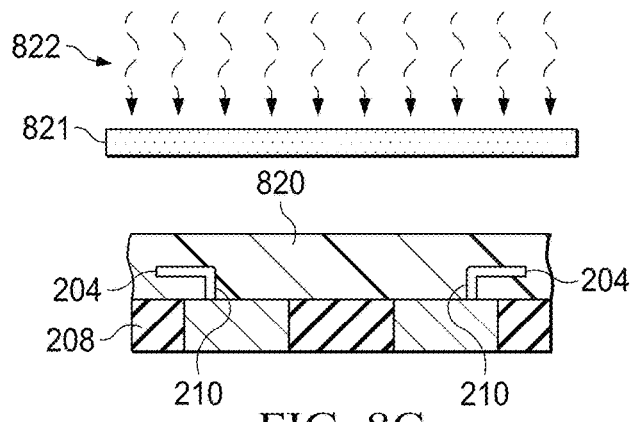

FIG. 8C illustrates a gray-scale mask 821 that may be used to expose photoresist layer 820 to a light source, such as ultraviolet (UV) light 822 or other short wavelength radiation. Gray-scale lithography uses a sub-resolution, two dimensional binary optical mask together with a photolithography stepper system to locally modulate the intensity of ultraviolet light or radiation. The modulated intensity of light will expose a photoresist to specified depths. After the exposed photoresist is developed, a gradient height profile will remain in the un-exposed photoresist.

The optical mask may be designed with sub-resolution features to cause diffraction of the UV light used in optical lithography. Different sub-resolution feature sizes may create different diffraction patterns. When the different diffraction patterns are passed through the optical lens system of a photolithography stepper, they will be converted to different intensity levels.

Figure 9:
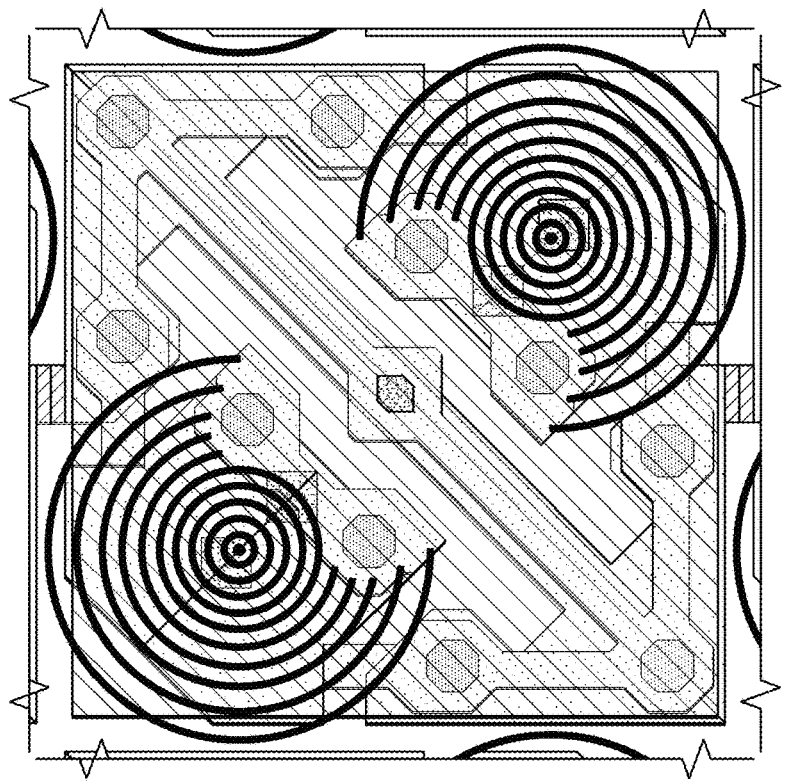
FIGS. 9 and 10 are example gray-scale masks.
Figure 10:
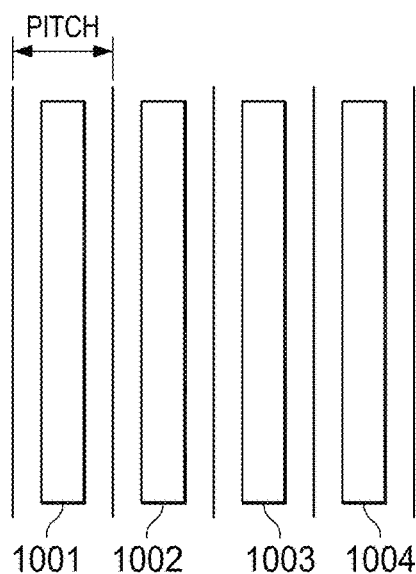

The individual sub-resolution mask features are called gray levels, with each level changing the intensity of the light by a specific amount. FIG. 9 shows an example of a gray-scale mask in the form of concentric opaque circles. FIG. 10 shows an example of a gray-scale mask in the form of adjacent rectangles. Other mask configurations may be used to form various three dimensional features in the photoresist layer, such as concentric squares, rectangles, ovals, etc. Similarly, mask configurations may include adjacent opaque circle, squares, rectangles, etc. The concentric features and adjacent features may be placed using a set pitch that is below the resolution limit of the photolithography stepper.

To generate different gray-levels, the size of the opaque features may be changed while remaining within the set pitch. The smaller the opaque feature, the larger amount of intensity that will pass through the optical lens system onto the photoresist layer. Therefore, a gradient intensity pattern can be created using different sizes of opaque features. This gradient intensity pattern will create a gradient of exposure depths into the photoresist masking layer.

Figure 8D:
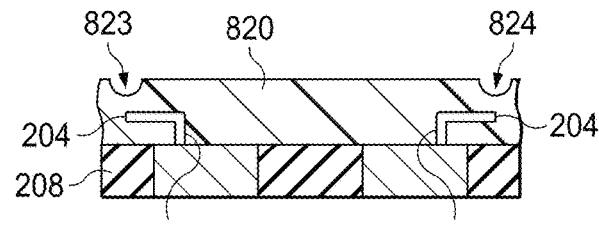

FIG. 8D illustrates example depressions 823, 824 that may be formed in sacrificial layer 820 after the exposed photoresist layer is developed. The exposed portion of the photoresist layer 820 is softened by exposure to light 822 and washed away during the development process. For example, the depth of the depressions may be controlled by the exposure time and intensity of light 822, and the depression may be in the form of a circle to form an elliptical protruding feature. Alternatively, the depression may be in the form of a rectangle to form a linear wedge shaped protruding feature. Other depression shapes may be produced to form additional types of protruding features.

Alternatively, a photoresist layer may be used that hardens in response to exposure to light. In this case, the exposed regions 823, 824 would remain as protrusions while a remainder of the top portion of the photoresist layer may be washed away during the development process.

Figure 8E:
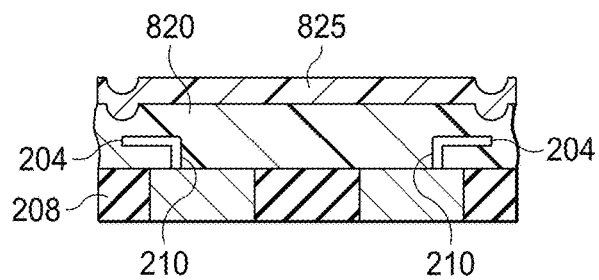

FIG. 8E illustrates deposition of a deformable metal layer 825 that covers sacrificial layer 820 and fills in depressions 823, 824. Metal layer 825 may then be patterned and etched using fabrication techniques to form a MEMS element such as micromirror 201, referring to FIG. 2.

Figure 8F:
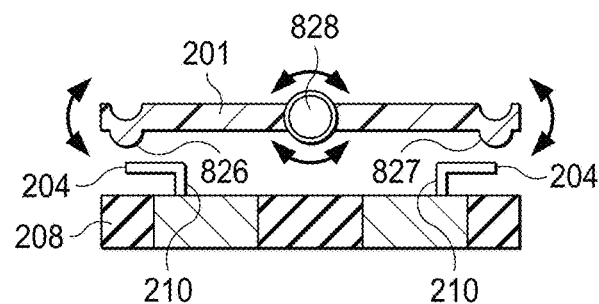

FIG. 8F illustrates completed micromirror 201 after removal of sacrificial layer 820. Micromirror 201 includes protruding contact surfaces 826, 827 that are configured to contact spring tips 204 when micromirror 201 rotates to the right or left around pivot axis 828. Pivot axis 828 is formed by torsion spring 203 and mirror via 211, referring to FIG. 2, but the details are not shown in FIG. 8F for simplicity.

Protruding acute contact surface 826, 827 may be smaller in size and therefore have a smaller radius than the feature size of the process due to the use of gray-scale photolithography.

FIGS. 9 and 10 are example gray-scale masks. FIG. 9 illustrates a gray-scale mask in the form of opaque concentric circles. FIG. 10 illustrates a gray-scale mask in the form of adjacent opaque rectangles. Each optical mask may be designed with sub-resolution features such as rectangles 1001-1004 to cause diffraction of the UV light used in optical lithography. Different sub-resolution feature sizes may create different diffraction patterns. When the different diffraction patterns are passed through the optical lens system of a photolithography stepper, they will be converted to different intensity levels.

Other mask configurations may be used to form various three dimensional features in the photoresist layer, such as: concentric squares, rectangles, ovals, etc.; and adjacent opaque circle, squares, rectangles, etc. The concentric features and adjacent features may be placed using a set pitch that is below the resolution limit of the photolithography stepper.

As described hereinabove, the size of the opaque features may be changed while remaining within the set pitch in order to generate different gray-levels. The smaller the opaque feature, the larger amount of intensity that will pass through the optical lens system onto the photoresist layer. Therefore, a gradient intensity pattern can be created using different sizes of opaque features. This gradient intensity pattern will create a gradient of exposure depths into the photoresist masking layer.

Figure 11:
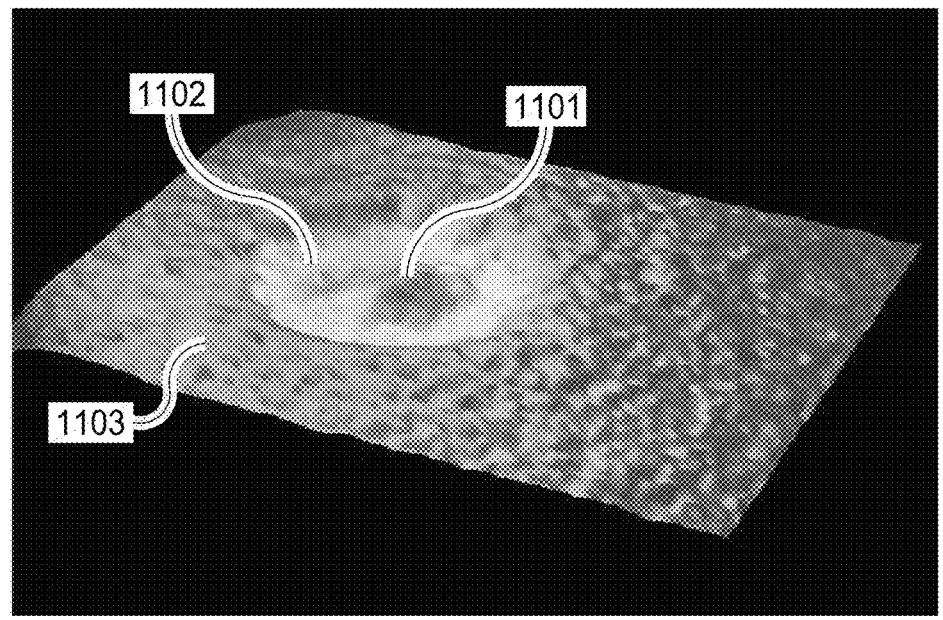
FIGS. 11 and 12 illustrate an example protruding feature fabricated using gray-scale photolithography.

FIG. 11 is a micro-photo of an example protruding feature 1101 fabricated using gray-scale photolithography with the concentric circles mask illustrated in FIG. 9. In this example, an ellipsoidal cap shaped feature 1101 is formed within a depressed toroidal region 1102. Protruding feature 1101 is formed within surface 1103, such as a metallic layer that was deposited over a photoresist layer using the process described in FIGS. 8A through 8F.

An ellipsoidal cap shaped feature may also be referred to as an "ellipsoidal tip" feature or a "zero dimension" (0-D) acute contact surface because the contact surface has essentially no length or width.

Figure 12:
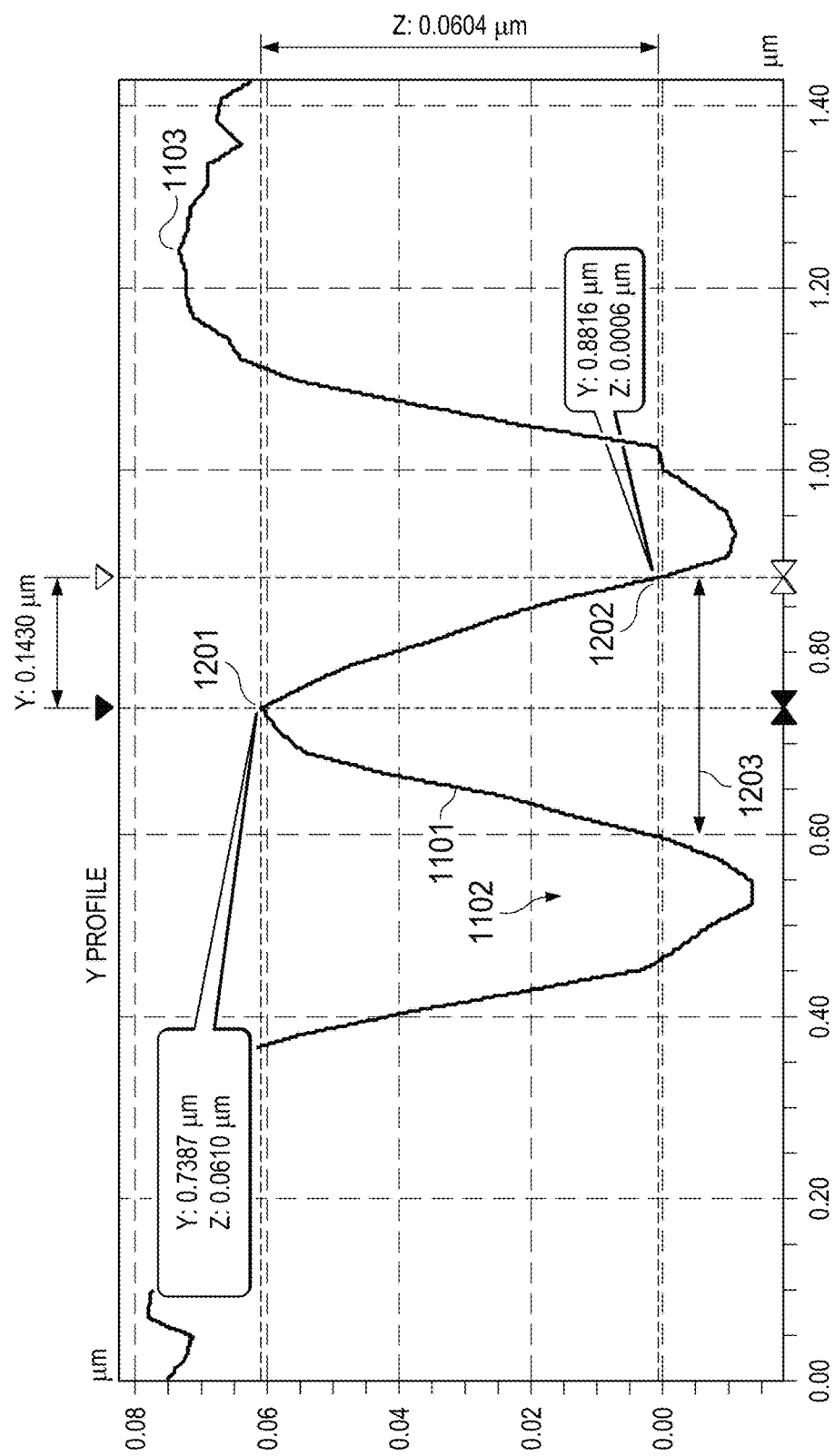

FIG. 12 is a plot illustrating a cross sectional profile view of surface 1103, as shown in FIG. 11. Acute contact surface 1201 is approximately 60 nm above location 1202. The contact surface tip 1201 may have a near circular radius of curvature. The base dimension 1203 of feature 1101 is approximately 286 nm. These dimensions were obtained using an Atomic Force Microscope (AFM). The lateral dimensions are artificially broadened by tip-broadening effects of the AFM; actual in-plane dimensions will be on the order of ½ this value (to ~0.1 um).

Figure 13:
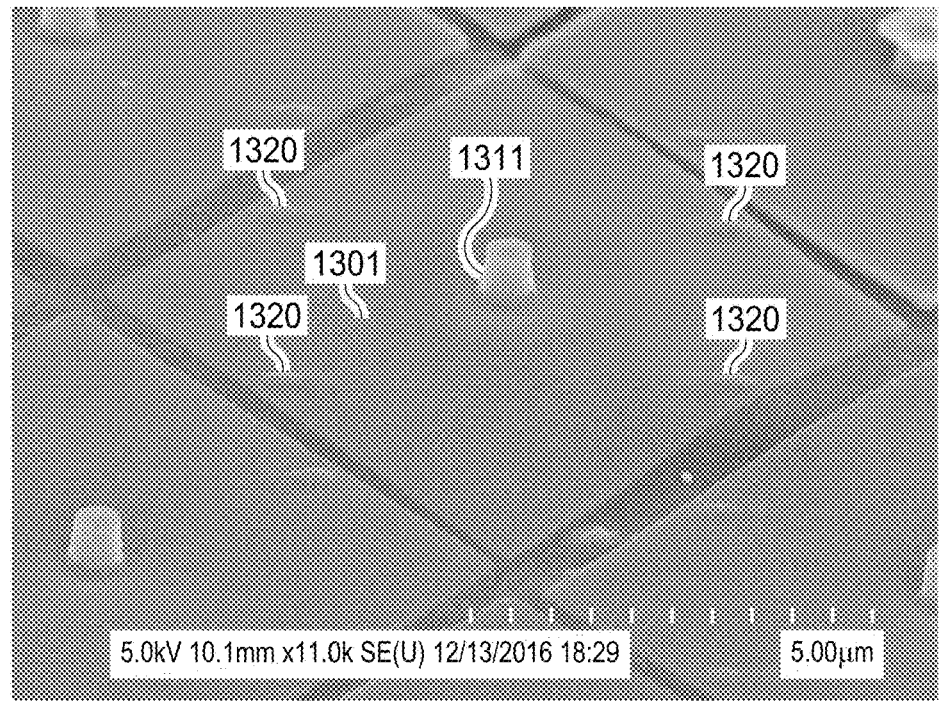
FIG. 13 is an image of the backside of several DMD mirrors.

FIG. 13 is an image of the backside of several DMD mirrors that were removed from a completed DMD chip by ripping them off with tape. Micromirror 1301 includes four linear wedge shaped protruding features 1320 that form acute contact surfaces that align with spring tips 204, as shown in FIG. 2. Protruding features 1320 were constructed using a gray-scale fabrication technique as described in connection with FIGS. 8A through 8F. In this example, the linear wedge shaped features 1320 have an amplitude of approximately 50 nm. The wedge shape provides for a wide range of location tolerance to assure that the contact edge of spring tips 204 will align with the contact edge of features 1320. In this manner, a significant reduction in stiction is realized in this micromirror embodiment.

Figure 14:
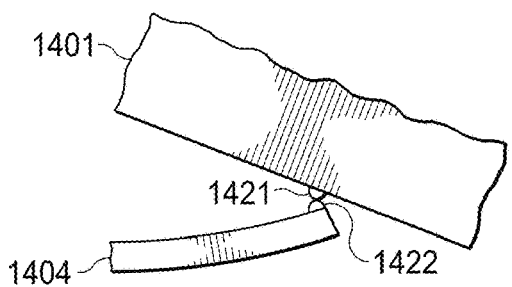
FIGS. 14 through 17 are side views of various embodiments of minimal lateral dimension contact surfaces.

FIGS. 14 through 17 are side views of various embodiments of minimal lateral dimension contact surfaces. In these examples, a protruding feature (on the elements that come in contact) may further reduce the stiction forces that are inherent in small elements fabricated in MEMS. FIG. 14 illustrates: (a) a first element 1401 of a MEMS, which may be a micromirror as described hereinabove; and (b) a second element 1404 of a MEMS, which may be a spring tip as described hereinabove. Element 1401 may move in an up and down direction and come in contact with element 1404, as described hereinabove. In this example, an ellipsoidal tip 1421 may be formed on the bottom side of element 1401, and another ellipsoid tip 1422 may be formed on the top side of element 1404 and aligned, so that contact is made only between ellipsoid tip 1421 and ellipsoid tip 1422 when element 1401 moves to contact element 1404. Ellipsoidal tips 1421, 1422 may also be referred to as "isolated tips" (iso-tips).

Figure 15:
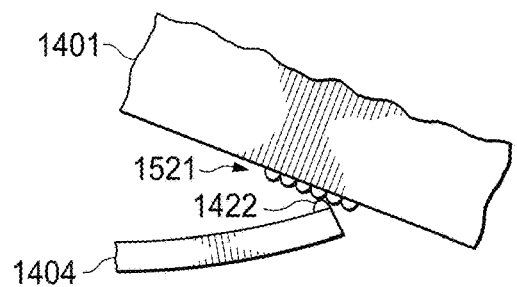

However, it may be difficult to manufacture elements 1401, 1404 and maintain proper alignment of contact protrusions 1421, 1422. In the example of FIG. 15, a group of ellipsoid tips 1521 is formed on the bottom side of element 1401, in order to provide a large number of contact points that may align with ellipsoid tip 1422 on element 1404. Similarly, in the example of FIG. 16, a group of ellipsoid tips 1622 is formed on the top side of element 1404, in order to provide a large number of contact points that may align with ellipsoid tip 1421 on element 1401. In the example of FIG. 17, a group of ellipsoid tips 1721 is formed on the bottom side of element 1401, in order to provide a large number of contact points. In this example, element 1404 may be fabricated with a simple flat surface and edge.

Figure 16:
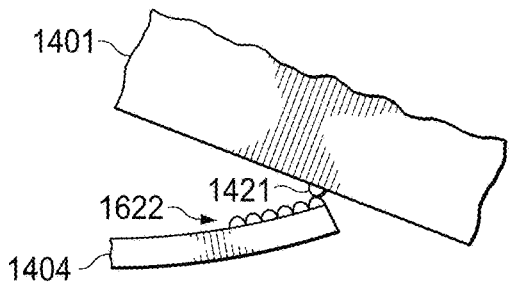
Figure 17:
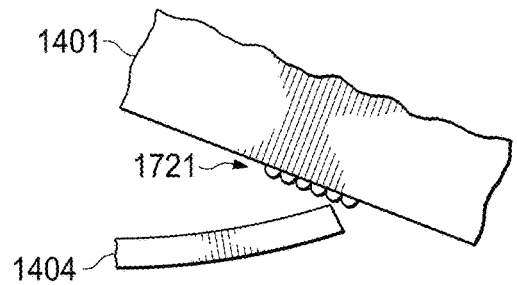
Figure 18:
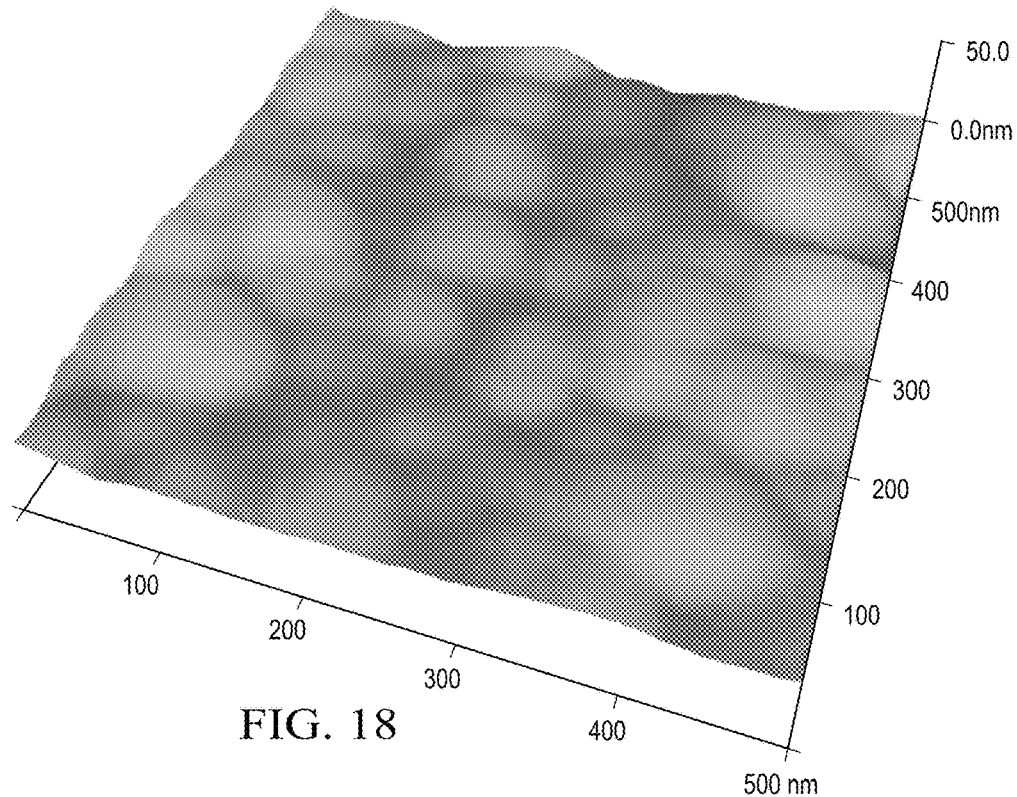
FIG. 18 illustrates an example contact surface that includes a set of protruding features.

FIG. 18 illustrates an example contact surface that includes a group of protruding features that may be used to form group 1521 in FIG. 15 and group 1622 in FIG. 16. Experiments obtained with an AFM probe have shown a 2×-3× adhesive reduction between the probe tip over a contact surface that has a group of protrusions as illustrated herein. In this manner, a much larger manufacturing tolerance may be achieved.

Gray-scale lithography may be used to form iso-tips 1421, 1422 as described with regard to FIGS. 8A through 8F. The iso-tips may have a near circular radius of curvature. A group of protruding features as illustrated in FIG. 17 may be fabricated in various manners. One way would be to fabricate a dense packing of iso-tips using gray-scale lithography with an appropriate mask. Another way would be to roughen the surface of the electrode or photoresist region where the complimentary contact is to be formed. This roughening may be accomplished by sputtering the metal surface of element 1404 (such as for a spring tip element) or the photoresist used to make the shape of the element 1401 (such as for a mirror element). In some embodiments, the roughened area may be implemented over a large area and not necessarily only at the anticipated location of the contact area.

FIGS. 19A through 19D illustrate another embodiment of a MEMS device that includes complimentary wedge shaped contact surfaces between two elements. FIGS. 19A through 19D illustrate an example of complimentary protruding contact surface features that may be applied to the pixel elements of FIG. 2; however, example embodiments are not limited to DMD devices and may be applied to a variety of movable elements embodied in a MEMS, in which a small contact surface may reduce stiction forces between the MEMS elements.

FIG. 19A is an isometric view of two elements 1901, 1904; FIG. 19B is a cross sectional view looking towards an end of element 1904; FIG. 19C is another cross sectional view looking at a right angle to FIG. 19B; and FIG. 19D is a top-down view. In this example, mirror element 1901 is similar to micromirror 201 in FIG. 7. Likewise, spring tip 1904 is similar to spring tip 204 in FIG. 7. Contact rib 1920 is similar to contact rib 720 in FIG. 7. Contact rib 1921 may be fabricated on the top surface of spring tip 1904 and oriented approximately perpendicular to contact rib 1920. This orthogonal arrangement of contact surfaces 1920, 1921 creates a single point of contact 1930 between MEMS elements 1901, 1904 while allowing for a large tolerance in the fabrication process and may therefore be immune to photo-alignment issues. In this example, the contact surface is oriented in a perpendicular relationship. In other examples, similar wedge shaped contact surfaces may be oriented cross-ways at an angle that is less than 90 degrees.

Contact rib 1920 may be fabricated using the gray-scale photolithography process described with reference to FIGS. 8A through 8F. Contact rib 1921 may be fabricated using a similar process in which the sacrificial layer is sculpted to form a protruding feature on the top of the sacrificial layer instead of a depression as illustrated in FIG. 8D. A metal layer may then be deposited, patterned and etched using fabrication techniques to form a MEMS element such as spring tip 1904 with integral contact rib 1921.

Other Embodiments

Example embodiments are not limited to DMD devices and may be applied to a variety of movable elements embodied in a MEMS, in which a small contact surface may reduce stiction forces between elements inherent in the MEMS.

Described examples include a MEMS with two levels of movable parts, but other example embodiments may include only a single level of movable parts or more than two levels. 0-D and 1-D acute contact surfaces may be formed on the top, bottom or sides of various mechanical elements, in order to reduce the stiction forces that are inherent in micro sized machines.

Described examples include a DMD with a tiltable mirror that lands on a spring tip structure, but other example embodiments of a DMD may have various configurations for tilting and landing the mirrors. For example, a tiltable yoke may be included under each micromirror, and the landing contact surface may be formed on the yoke.

Described examples include two spring tips on each side of each micromirror for landing the tiltable micromirror, but other example embodiments of a DMD may have only a single landing point or more than two landing points on each side of each tiltable mirror.

Although method steps may be shown in the drawings and/or described herein in a sequential fashion, one or more of the steps may be omitted, repeated, performed concurrently, and/or performed in a different order than the order shown in the drawings and/or described herein.

Modifications are possible in the described embodiments, and other embodiments are possible, within the scope of the claims.

What is claimed is:

1. A microelectromechanical system (MEMS), comprising:
   a substrate;
   a first element mounted on the substrate and having a first wedge shaped protrusion, the first wedge shaped protrusion having a first edge; and
   a second element mounted on the substrate and having a second wedge shape protrusion, the second wedge shaped protrusion having a second edge oriented crossways to the first edge;
   the first element configured to move in: a first direction for the first edge to contact the second edge; and a second direction for the first edge to separate from the second edge.

2. The MEMS of claim 1, wherein the second edge has a radius of curvature of less than 10.0 microns.

3. The MEMS of claim 1, wherein the second edge has a radius of curvature of less than 1.0 micron.

4. An integrated circuit (IC) comprising:
   a substrate having first and second memory cells; and
   first and second pixel modulator elements respectively coupled to the first and second memory cells, each of the first and second pixel modulator elements including: a respective landing element mounted on the substrate and having a respective first wedge shaped protrusion, the respective first wedge shaped protrusioln having a respective first edge; and a respective tiltable micromirror mounted on the substrate and having a respective second wedge shape protrusion, the respective second wedge shaped protrusion having a respective second edge oriented cross-ways to the respective first edge;
   the respective tiltable micromirror configured to tilt in: a first direction for the respective second edge to contact the respective first edge; and a second direction for the respective second edge to separate from the respective first edge.

5. The IC of claim 4, wherein the second edge has a radius of curvature of less than 10.0 um.

6. The IC of claim 4, wherein the second edge has a radius of curvature of less than 1.0 micron.

7. An integrated circuit (IC) comprising:
   a substrate having first and second memory cells; and
   first and second pixel modulator elements respectively coupled to the first and second memory cells, each of the first and second pixel modulator elements including: a respective landing element mounted on the substrate and having a respective first contact surface; and a respective tiltable micromirror mounted on the substrate and having a respective second contact surface, the respective second contact surface including protrusions;
   the respective tiltable micromirror configured to tilt in: a first direction for only one of the protrusions to contact the respective first contact surface; and a second direction for the respective second contact surface to separate from the respective first contact surface.

* * * * *